United States Patent
Joseph et al.

(10) Patent No.: US 9,799,519 B1
(45) Date of Patent: Oct. 24, 2017

(54) SELECTIVE SPUTTERING WITH LIGHT MASS IONS TO SHARPEN SIDEWALL OF SUBTRACTIVELY PATTERNED CONDUCTIVE METAL LAYER

(71) Applicant: International Business Machines Corporation, Armonk, NY (US)

(72) Inventors: Eric A. Joseph, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/192,196

(22) Filed: Jun. 24, 2016

(51) Int. Cl.
*H01L 21/768* (2006.01)
*H01L 21/263* (2006.01)
*H01L 23/528* (2006.01)
*H01L 23/532* (2006.01)

(52) U.S. Cl.
CPC .... *H01L 21/2633* (2013.01); *H01L 21/76829* (2013.01); *H01L 21/76862* (2013.01); *H01L 23/5283* (2013.01); *H01L 23/5329* (2013.01); *H01L 23/53238* (2013.01)

(58) Field of Classification Search
CPC ............... H01L 21/28; H01L 21/28008; H01L 21/28017; H01L 21/3213; H01L 21/53238; H01L 21/76829; H01L 21/76862; H01L 21/8238
See application file for complete search history.

(56) References Cited

U.S. PATENT DOCUMENTS

| 8,633,117 B1 | 1/2014 | Cabral et al. |
| 8,871,107 B2 | 10/2014 | Fuller et al. |
| 9,064,727 B2 | 6/2015 | Cabral, Jr. et al. |
| 9,171,796 B1 | 10/2015 | Brink et al. |

(Continued)

OTHER PUBLICATIONS

IBM.com, "Copper Interconnects: The Evolution of Microprocessors," http://www-03.ibm.com/ibm/history/ibm100/us/en/icons/copperchip/, Apr. 11, 2015, 3 pages.

(Continued)

*Primary Examiner* — Cuong Q Nguyen
(74) *Attorney, Agent, or Firm* — Louis J. Percello; Ryan, Mason & Lewis, LLP (57) ABSTRACT

A dielectric layer is formed on a silicon substrate. A liner layer is formed on the dielectric layer. A conductive metal layer is formed on the liner layer. A first sputter etching operation is performed on the conductive metal layer, wherein the first sputter etching operation uses a first type of etch chemistry configured to subtractively pattern the conductive metal layer for a first etching time period resulting in the remaining conductive metal layer having respective sidewalls that are not substantially vertical. A second sputter etching operation is performed on the remaining conductive metal layer, wherein the second sputter etching operation uses a second type of etch chemistry configured to further subtractively pattern the remaining conductive metal layer for a second etching time period resulting in the remaining conductive metal layer having respective sidewalls that are substantially vertical. The conductive metal layer remaining after the second sputter etching operation comprises a metal interconnect.

18 Claims, 5 Drawing Sheets

(56) References Cited

U.S. PATENT DOCUMENTS

| | | |
|---|---|---|
| 9,257,638 B2 * | 2/2016 | Tan .................... H01L 43/12 |
| 9,263,393 B2 | 2/2016 | Cabral, Jr. et al. |
| 2014/0162448 A1 * | 6/2014 | Ji ........................ H01L 21/283 |
| | | 438/591 |
| 2015/0014152 A1 | 1/2015 | Hoinkis et al. |
| 2015/0243602 A1 | 8/2015 | Cabral, Jr. et al. |

OTHER PUBLICATIONS

Wikipedia, "Copper Interconnect," https://en.wikipedia.org/wiki/Copper_interconnect, Jan. 14, 2016, 3 pages.

* cited by examiner

SELECTIVE SPUTTERING WITH LIGHT MASS IONS TO SHARPEN SIDEWALL OF SUBTRACTIVELY PATTERNED CONDUCTIVE METAL LAYER

BACKGROUND

As the feature sizes in complementary metal-oxide-semiconductor (CMOS) technology continue to shrink, it becomes increasingly difficult to fabricate metal interconnects using conventional processing techniques. For example, using a damascene process to fill trenches with copper often results in undesirable effects including poor liner/seed coverage on the trench walls, pinch off at the trench mouth, and reentrant reactive ion etch (ME) profiles. In addition, the increasing ratio of the liner to copper, copper grain growth, and copper grain scattering phenomena result in increased copper resistivity, which makes the copper less effective as an interconnect material.

SUMMARY

Embodiments provide techniques for metal patterning processes for use in manufacturing semiconductor structures and integrated circuits. While embodiments are not limited thereto, the metal patterning techniques described herein provide improvements to the use of copper or a similar element as the conductive metal used to form interconnects in a semiconductor structure or an integrated circuit.

For example, in one embodiment, a method for forming a metal interconnect in a semiconductor structure comprises the following steps. A dielectric layer is formed on a silicon substrate. A liner layer is formed on the dielectric layer. A conductive metal layer is formed on the liner layer. A first sputter etching operation is performed on the conductive metal layer, wherein the first sputter etching operation uses a first type of etch chemistry configured to subtractively pattern the conductive metal layer for a first etching time period resulting in the remaining conductive metal layer having respective sidewalls that are not substantially vertical. A second sputter etching operation is performed on the remaining conductive metal layer, wherein the second sputter etching operation uses a second type of etch chemistry configured to further subtractively pattern the remaining conductive metal layer for a second etching time period resulting in the remaining conductive metal layer having respective sidewalls that are substantially vertical. The conductive metal layer remaining after the second sputter etching operation comprises the metal interconnect.

Advantageously, in an illustrative embodiment, the subtractive process uses a methanol based etch chemistry for a main sputter etch process (e.g., first sputter etching operation), followed by an over-etch process using selective sputtering with light mass ions (e.g., second sputter etching operation). The process provides for a vertically sharpened sidewall profile (i.e., converted from not substantially vertical or pyramidal shape to substantially vertical) for the metal interconnect.

DETAILED DESCRIPTION

In illustrative embodiments, techniques are provided for metal patterning using a first main-etch process followed by a second over-etch process. More particularly, illustrative embodiments pattern fine copper (Cu) metal lines on an insulating layer of an integrated circuit via a subtractive process (i.e., a process that creates a desired structure by removing material rather than by adding material). In a particular illustrative embodiment, the subtractive process uses methanol etch chemistry for a main sputter etch process, followed by an over-etch process using selective sputtering with light mass ions. The process provides for a well-controlled (e.g., vertically sharpened or about 90 degrees) sidewall profile for metal (Cu) interconnects without tapering.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional integrated circuit device. Rather, certain steps that are commonly used in forming such devices, such as, for example, but not limited to, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a margin of error is present. The margin of error depends on the application-specific metric that is being described. In one example, 1% or less may represent a reasonable margin of error. However, in another case, 5-15% could be an appropriate margin of error. The main point is that it depends on the metric and the specific application of the metric.

In the case of illustrative embodiments, it is explained herein that a conductive metal layer with sidewalls that form a pyramidal shape (not substantially vertical) is processed so as to result in respective sidewalls that are substantially vertical. Here, any improvement in making the sidewalls less pyramidal in shape and more vertical (closer to 90 degrees) is considered beneficial. However, in one illustrative embodiment, a sidewall angle at or better than about 80-85 degrees (margin of error between 5-15% with respect to 90 degrees) is desirable for the tight pitch patterning of Cu for an interconnect application.

Also, in the figures, the illustrated scale of one layer, structure, and/or region relative to another layer, structure, and/or region is not necessarily intended to represent actual scale.

FIGS. 1A-1K are schematic cross-sectional diagrams illustrating various stages of the fabrication of a metal interconnect for a complementary metal oxide semiconductor (CMOS) device 100, according to embodiments of the present invention. As such, FIGS. 1A-1K also collectively serve as a flow diagram illustrating portions of one or more embodiments of a method for fabricating a portion of CMOS device 100. It is to be understood that, for the sake of clarity of illustration, while the figures depict fabrication of a single interconnect, the steps of the process of FIGS. 1A-1K are applicable for fabricating multiple such interconnects on CMOS device 100. Also, the portion of the CMOS device 100 shown may also be referred to herein as a CMOS structure or a semiconductor structure, and the CMOS device or structure may be part of an integrated circuit. Thus, reference numeral 100 is understood to reference a CMOS structure, a CMOS device, and/or a CMOS integrated circuit.

Figure 1A:
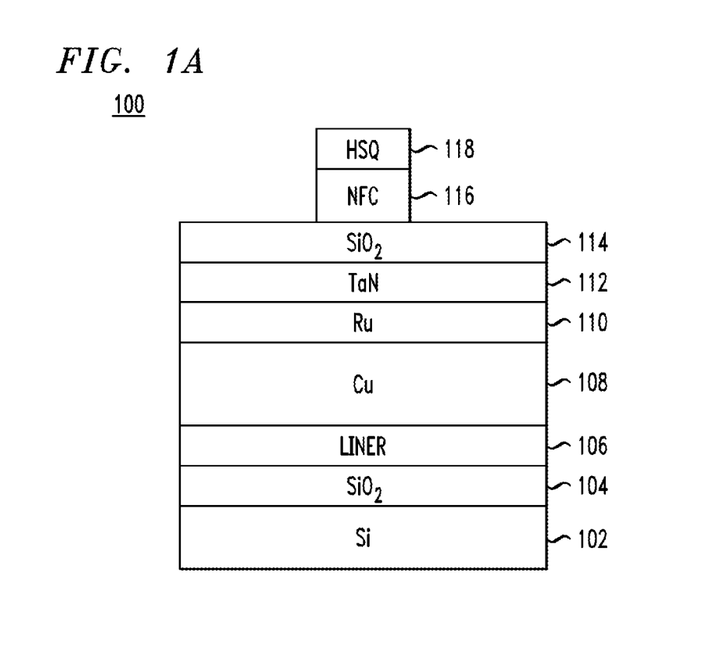
FIG. 1A is a schematic cross-sectional side view of a portion of a complementary metal oxide semiconductor device at a first-intermediate interconnect fabrication stage, according to an embodiment of the invention.

In particular, FIG. 1A illustrates the CMOS device 100 at a first intermediate stage in the processing. For the purpose of clarity, several fabrication steps leading up to the production of the CMOS device 100 as illustrated in FIG. 1A are omitted. In other words, the CMOS device 100 does not necessarily start out in the form illustrated in FIG. 1A, but may develop into the illustrated structure over several well-known processing steps which are not illustrated but are well-known to those of ordinary skill in the art.

The CMOS device 100 comprises a plurality of layers at this intermediate stage in the processing, including: a silicon wafer (silicon substrate) 102, a first dielectric layer 104 (e.g., comprising silicon dioxide ($SiO_2$), silicon nitride ($Si_3N_4$), silicon oxynitride (SiON), or a low-k dielectric) formed on the silicon wafer 102, a first liner layer 106 (e.g., comprising titanium (Ti), titanium nitride (TiN), ruthenium (Ru), tungsten (W), iridium (Ir), gold (Au), platinum (Pt), tantalum (Ta), tantalum nitride (TaN), cobalt (Co), manganese (Mn), manganese oxides ($MnO_x$), or manganese silicates ($Mn-Si_xO_y$)) formed on the first dielectric layer 104, a conductive metal layer 108 (e.g., comprising copper (Cu), a copper alloy, silver (Ag), cobalt (Co), Au, Ir, Pt), formed on the first liner layer 106, a protective layer 110 (e.g., comprising Ru, Ir, Ta, W, or TaN) formed on the conductive metal layer 108, a first hard mask layer 112 (e.g., comprising Ti, TiN, Ta, TaN, niobium (Nb), or vanadium (V)) formed on the protective layer 110, a second hard mask layer 114 (e.g., comprising $SiO_2$ or $Si_3N_4$) formed on the first hard mask layer 112, an organic underlayer 116 (e.g., comprising near frictionless carbon (NFC) or an organic planarizing layer (OPL)) formed on the second hard mask layer 114, and a photoresist or electron beam resist layer 118 (e.g., comprising hydrogen silsesquioxane (HSQ)) formed on the organic underlayer 116. Although the dimensions of the layers and liners shown in FIG. 1A are application-specific, in one illustrative sub-100 nanometer (nm) embodiment, an exemplary range of approximate thickness for each layer comprises: HSQ: 10-50 nm; OPL: 50-300 nm; $SiO_2$: 0-150 nm; TaN: 10-200 nm; Ru: 5-30 nm; Cu: 20-100 nm. Thicknesses of other layers (shown and not shown) are determinable by one of ordinary skill in the semiconductor processing art.

FIG. 1A illustrates the CMOS device 100 at a stage after a small structure has been formed in the organic underlayer 116 and photoresist layer 118 (actually a pattern of small structures is formed but, as mentioned above, only a single one is shown for clarity). In one illustrative embodiment, the organic underlayer 116 and photoresist layer 118 are patterned using a photolithography technique, such as optical lithography or direct write electron beam lithography. In one illustrative embodiment, the photolithography technique includes a negative resist that allows removal of the organic underlayer 116 and photoresist layer 118 down to the second hard mask layer 114, except for the portions of the organic underlayer 116 and photoresist layer 118 illustrated in FIG. 1A.

Figure 1B:
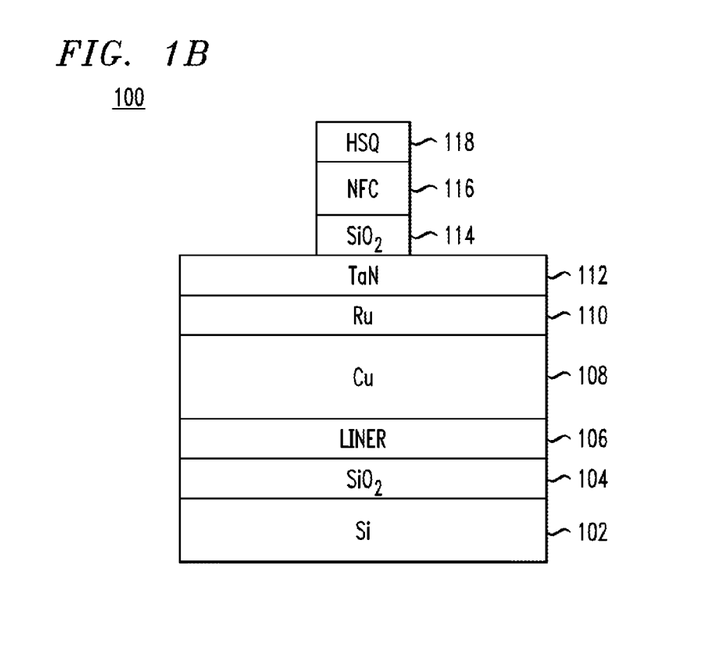
FIG. 1B is a schematic cross-sectional side view of a portion of a complementary metal oxide semiconductor device at a second-intermediate interconnect fabrication stage, according to an embodiment of the invention.

As illustrated in FIG. 1B, the pattern is transferred from the organic underlayer 116 and photoresist layer 118 to the second hard mask layer 114. In one illustrative embodiment, pattern transfer involves etching the second hard mask layer 114 down to the first hard mask layer 112 (e.g., using a dry etch process such as reactive ion etching). Pattern transfer results in portions of the second hard mask layer 114 being removed. For instance, in the embodiment illustrated in FIG. 1B, all portions of the second hard mask layer 114 except for the portions residing directly beneath the organic underlayer 116 and photoresist layer 118 are removed down to the first hard mask layer 112.

Figure 1C:
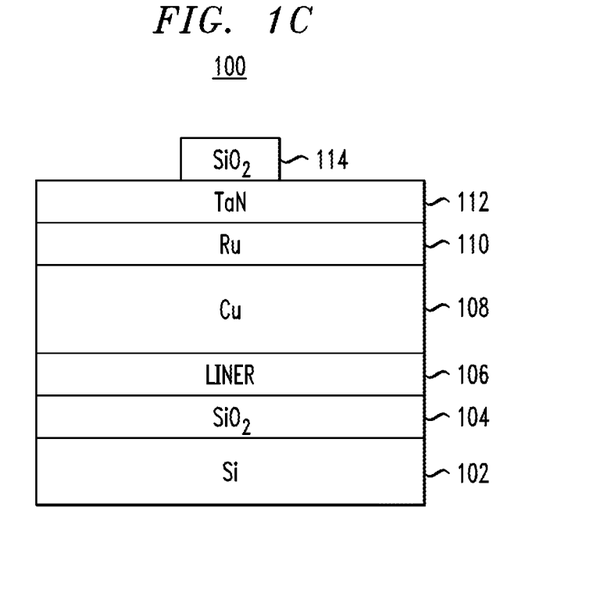
FIG. 1C is a schematic cross-sectional side view of a portion of a complementary metal oxide semiconductor device at a third-intermediate interconnect fabrication stage, according to an embodiment of the invention.
Figure 1D:
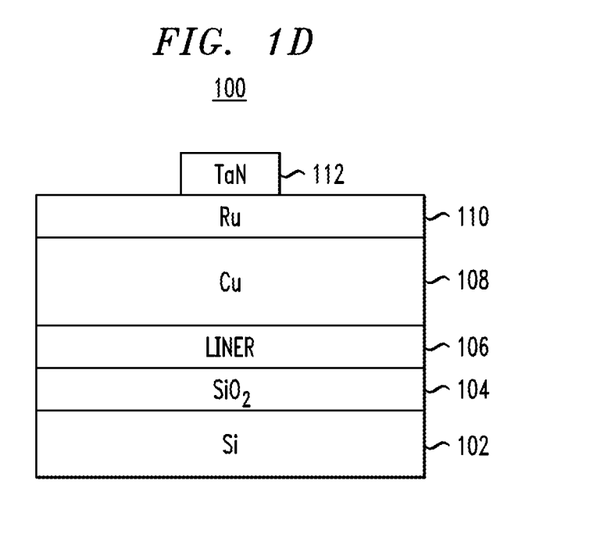
FIG. 1D is a schematic cross-sectional side view of a portion of a complementary metal oxide semiconductor device at a fourth-intermediate interconnect fabrication stage, according to an embodiment of the invention.

As illustrated in FIG. 1C, the organic underlayer 116 and photoresist layer 118 are next removed down to the second hard mask layer 114, leaving the patterned second hard mask layer 114. As illustrated in FIG. 1D, the pattern is next transferred from the second hard mask layer 114, which is removed, to the first hard mask layer 112. In one illustrative embodiment, the pattern transfer from the second hard mask layer 114 to the first hard mask layer 112 is accomplished in a manner similar to that described above (e.g., etching followed by removal of second hard mask material). In the embodiment illustrated in FIG. 1D, the pattern transfer results in the first hard mask layer 112 being etched down to the protective layer 110, except for the portion of the first hard mask layer 112 residing directly beneath the second hard mask layer 114. It is to be understood that the protective layer 110 protects the Cu material of the conductive metal layer 108 from the RIE chemistry used for the TaN (first hard mask layer 112) etch.

Figure 1E:
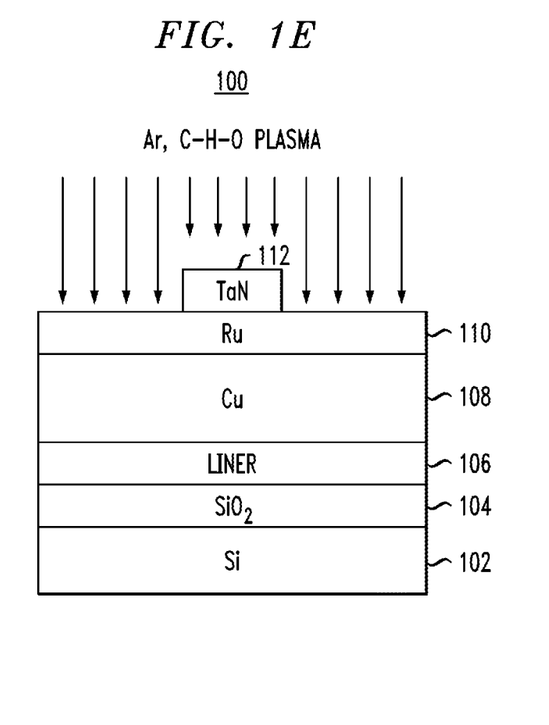
FIG. 1E is a schematic cross-sectional side view of a portion of a complementary metal oxide semiconductor device at a fifth-intermediate interconnect fabrication stage, according to an embodiment of the invention.
Figure 1F:
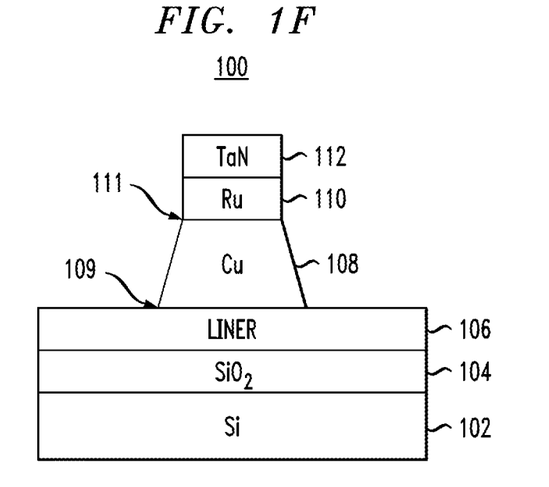
FIG. 1F is a schematic cross-sectional side view of a portion of a complementary metal oxide semiconductor device at a sixth-intermediate interconnect fabrication stage, according to an embodiment of the invention.

A main plasma etch process is next applied as illustrated in FIG. 1E to remove portions of the protective layer 110 and the conductive metal layer 108 as illustrated in FIG. 1F. In one illustrative embodiment, an argon (Ar) and/or a methanol ($CH_3OH$ or more generally a C—H—O RIE chemistry) plasma sputter etch process is used to remove the portions of the protective layer 110 and the conductive metal layer 108. More specifically, C—H—O or C—H or $NH_3$ ($NH_3$ or $NH_3$—CO or $NH_3$-Hydrocarbons) containing plasma can be employed for the main etch process. Still further, any of the plasma etch chemistry disclosed in U.S. Pat. Nos. 8,871,107, 9,064,727, 9,290,848, and U.S. Patent Publication Nos. 2014/0110373, 2014/0251945, the disclosures of which are incorporated herein by reference in their entireties, can be employed for the main etch process. Alternatively, an $O_2$ based RIE chemistry can be used to separately etch the protective layer 110.

In the embodiment illustrated in FIGS. 1E and 1F, the protective layer 110 is etched except for the portion of the protective layer 110 residing beneath the first hard mask layer 112, while the conductive metal layer 108 is etched down to the first liner layer 106, except for the portions of the conductive metal layer 108 substantially residing beneath the first hard mask layer 112. It is to be understood that the remaining portions of the conductive metal layer 108 form a metal interconnect (also referred to as a metal line). In one illustrative embodiment, the metal interconnect has a shape in which the base 109 of the metal interconnect is wider than the top 111 of the metal interconnect (for instance, the base may be twice as wide as the top). Thus, the metal interconnect has a substantially pyramidal profile (having, for example, a sidewall taper of approximately less than 80 degrees, as measured with respect to the horizontal top surface of the first liner layer 106). In a further illustrative embodiment, the height of the metal interconnect is greater than the width of the metal interconnect at its widest point (e.g., at least 20 percent greater than the width of the base).

Figure 1G:
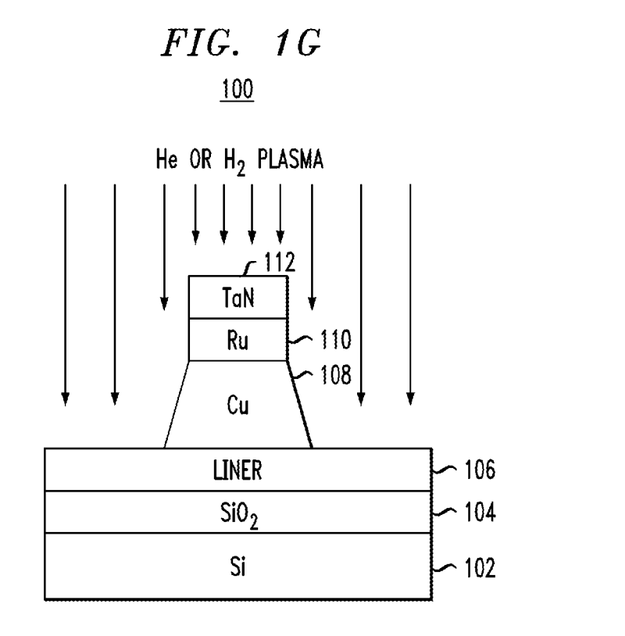
FIG. 1G is a schematic cross-sectional side view of a portion of a complementary metal oxide semiconductor device at a seventh-intermediate interconnect fabrication stage, according to an embodiment of the invention.
Figure 1H:
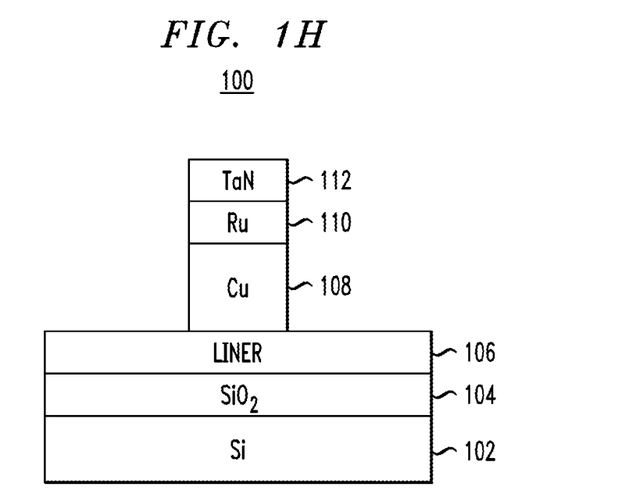
FIG. 1H is a schematic cross-sectional side view of a portion of a complementary metal oxide semiconductor device at an eighth-intermediate fabrication stage, according to an embodiment of the invention.

FIGS. 1G and 1H illustrate the second etching process, referred to herein as an over-etch process, comprising selective sputtering with low energy light mass ions, e.g., using helium (He) or dihydrogen ($H_2$) plasma. Alternatively, light mass ion beam process may be employed. More particularly, FIG. 1G illustrates application of the over-etch process to the structure from FIG. 1F, with the results of the over etching depicted in FIG. 1H.

Light mass ions, such as He or $H_2$, at low energy achieve very high selectivity to the first hard mask layer 112, the protective layer 110, and the first liner layer 106 during subtractive etching of the conductive metal layer 108. This selective sputtering provides a distinct advantage in controlling the conductive metal layer profile, in this example, the Cu profile, resulting in substantially vertical sidewalls for the conductive metal (Cu) feature. As illustrated in FIG. 1H, the low energy light mass ion plasma over-etch achieves a nearly 90 degree sidewall taper angle of the conductive metal layer 108, while not effecting the first liner layer 106 or the first hard mask layer 112 and the protective layer 110.

For example, He plasma in accordance with an illustrative embodiment, having an ion energy less than approximately 500 electron volts (eV), is very selective to the first hard mask layer 112 and the bottom liner (layer 106) comprising Ta/TaN. While the main etch has a high etch rate typically greater than approximately 1 nanometer per second (nm/s) wherein the exposure time may be on the order of approximately 10-30 seconds, an exposure time of approximately 1-10 minutes to the He plasma at an etch rate of approximately 5-10 nm/min (nanometers/minute) results in achieving the vertical (sharpened) sidewalls. The resulting structure advantageously allows for a tighter pitch of the Cu conductor, e.g., smaller than approximately 100 nm pitch.

Figure 1I:
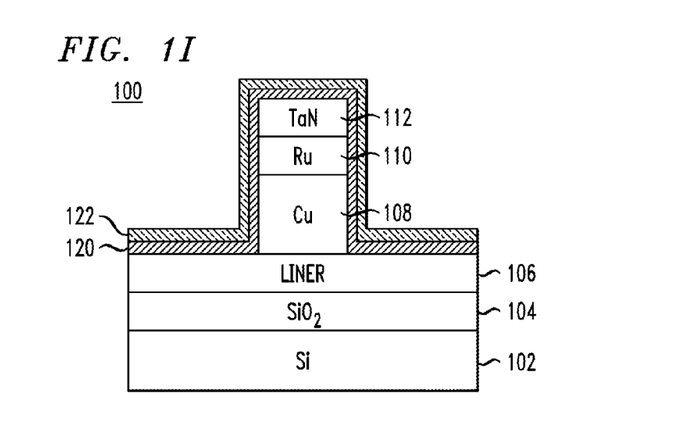
FIG. 1I is a schematic cross-sectional side view of a portion of complementary metal-oxide-semiconductor device at a ninth-intermediate interconnect fabrication stage, according to an embodiment of the invention.
Figure 1J:
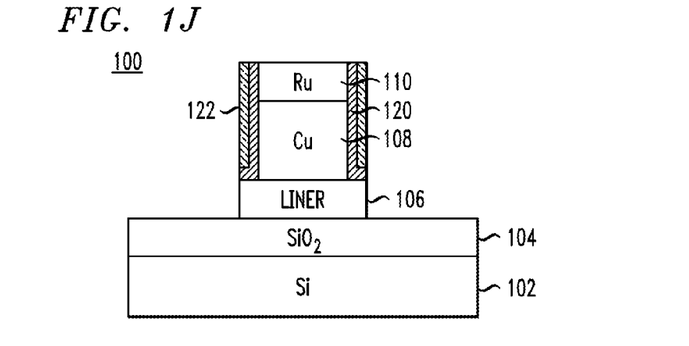
FIG. 1J is a schematic cross-sectional side view of a portion of a complementary metal oxide semiconductor device at a tenth-intermediate interconnect fabrication stage, according to an embodiment of the invention.
Figure 1K:
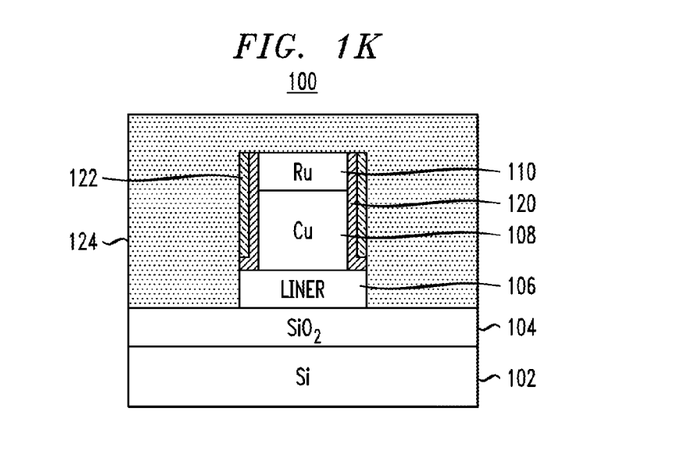
FIG. 1K is a schematic cross-sectional side view of a portion of a complementary metal oxide semiconductor device at an eleventh-intermediate interconnect fabrication stage, according to an embodiment of the invention.

FIGS. 1I though 1K illustrate remaining steps in fabricating the metal interconnect in the CMOS device 100. As illustrated in FIG. 1I, a liner 120 is formed over the CMOS device 100 coating portions of the first liner layer 106, the vertical sidewalls of the conductive metal layer 108 and the protective layer 110, and the first hard mask layer 112. In one illustrative embodiment, the liner 120 is deposited by atomic layer deposition or related techniques (e.g., physical vapor deposition). A mask layer 122 is then deposited over liner 120. In illustrative embodiments, liner 120 may comprise about 0.5-5 nm Ta, Co, or Ru, while mask layer 122 may comprise about 0.5-5 nm TaN, TiN, Mn, or MnO.

As illustrated in FIG. 1J, at least the portion of the liner layer 120 that coats the first liner layer 106 and the corresponding portion of the mask layer 122, the first liner layer 106 under the liner layer 120, and all of the first hard mask layer 112, are removed. The portions of the liner 120 coating the sidewalls of the conductive metal layer 108 and the protective layer 110, and the corresponding portion of the mask layer 122, remain intact.

As illustrated in FIG. 1K, a dielectric layer 124 (e.g., comprising a low-k dielectric material for which k is less than approximately 4.0) is next deposited over the CMOS device 100 and planarized (e.g., chemical-mechanical planarization). Any suitable interconnect dielectrics can be applied, e.g., SiO, SiCO, SiN, SiNC, or SiCON, coated by chemical vapor deposition (CVD) or spun on. Specifically, the dielectric layer 124 fills in the empty space in the CMOS device 100, coating portions of the first dielectric layer 104, the liner layer 106, the liner 120, the mask layer 122, and the protective layer 110. The resultant structure thus includes a trench (i.e., the interior volumes defined by the dielectric 104, the first liner layer 106, the liner 120, and the mask layer 122, which collectively form a conformal liner for the trench) containing a fine metal interconnect or line (i.e., the conductive metal layer 108).

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for forming a metal interconnect in a semiconductor structure, comprising:
    forming a dielectric layer on a silicon substrate;
    forming a liner layer on the dielectric layer;
    forming a conductive metal layer on the liner layer;
    performing a first sputter etching operation on the conductive metal layer, wherein the first sputter etching operation uses a first type of etch chemistry configured to subtractively pattern the conductive metal layer for a first etching time period resulting in the remaining conductive metal layer having respective sidewalls that are not substantially vertical; and
    performing a second sputter etching operation on the remaining conductive metal layer, wherein the second sputter etching operation uses a second type of etch chemistry configured to further subtractively pattern the remaining conductive metal layer for a second etching time period resulting in the remaining conductive metal layer having respective sidewalls that are substantially vertical;
    wherein the conductive metal layer remaining after the second sputter etching operation comprises the metal interconnect.

2. The method of claim 1, wherein the first type of etch chemistry of the first sputter etching operation comprises argon plasma.

3. The method of claim 1, wherein the first type of etch chemistry of the first sputter etching operation comprises one of a C—H—O, C—H, and NH$_3$ containing plasma.

4. The method of claim 1, wherein the second type of etch chemistry of the second sputter etching operation comprises a light mass ion based etch chemistry.

5. The method of claim 4, wherein the light mass ion based etch chemistry comprises one of a light mass ion plasma and a light mass ion beam.

6. The method of claim 4, wherein the light mass ion etch is applied at an ion energy level that is selective with respect to a given material of the liner layer and a hard mask layer formed above the conductive metal layer.

7. The method of claim 5, wherein the light mass ion plasma comprises helium plasma.

8. The method of claim 5, wherein the light mass ion plasma comprises hydrogen plasma.

9. The method of claim 1, wherein the conductive metal layer comprises a material selected from a group including: copper, silver, gold, cobalt, iridium, or platinum.

10. The method of claim 1, wherein the liner layer comprises a material selected from a group including: titanium, titanium nitride, ruthenium, tungsten, iridium, gold, platinum, tantalum, tantalum nitride, cobalt, manganese, a manganese oxide, or a manganese silicate.

11. The method of claim 1, further comprising forming a protective layer on the conductive metal layer prior to the first sputter etching operation.

12. The method of claim 11, further comprising forming a first mask layer on the protective layer.

13. The method of claim 12, further comprising forming a second mask layer on the first mask layer.

14. The method of claim 13, further comprising forming an organic underlayer on the second mask layer.

15. The method of claim 14, further comprising forming a resist layer on the organic underlayer.

16. The method of claim 15, further comprising performing one or more removal operations on the protective layer, the first mask layer, the second mask layer, the organic underlayer and the resist layer prior to the first sputter etching operation such that the semiconductor structure comprises a remaining part of the first mask layer and a remaining part of the protective layer prior to the first sputter etching operation.

17. The method of claim 16, further comprising:
    forming another liner layer on the remaining first mask layer, the remaining protective layer, the remaining conductive metal layer, and the liner layer after the second sputter etching operation;
    forming another mask layer on the other liner layer; and
    removing the first mask layer, part of the other mask layer, part of the liner layer; and
    part of the other liner layer.

18. The method of claim 17, further comprising forming a dielectric layer over the remaining semiconductor structure.

* * * * *